(12) United States Patent
Yang

(10) Patent No.: US 8,981,571 B2
(45) Date of Patent: Mar. 17, 2015

(54) PACKAGE ASSEMBLY AND METHOD OF MANUFACTURING THE SAME

(71) Applicants: Ambit Microsystems (Zhongshan) Ltd., Zhongshan (CN); Hon Hai Precision Industry Co., Ltd., New Taipei (TW)

(72) Inventor: Wang-Lai Yang, Zhongshan (CN)

(73) Assignee: Shunsin Technology (Zhong Shan) Limited, Zhongshan (CN)

( * ) Notice: Subject to any disclaimer, the term of this patent is extended or adjusted under 35 U.S.C. 154(b) by 0 days.

(21) Appl. No.: 13/859,561

(22) Filed: Apr. 9, 2013

(65) Prior Publication Data

US 2014/0054792 A1    Feb. 27, 2014

(30) Foreign Application Priority Data

Aug. 27, 2012   (CN) .......................... 2012 1 0309071

(51) Int. Cl.
| | |
|---|---|
| H01L 23/52 | (2006.01) |
| H01L 23/498 | (2006.01) |
| H01L 21/56 | (2006.01) |
| H01L 23/31 | (2006.01) |
| H01L 23/13 | (2006.01) |

(52) U.S. Cl.
CPC .......... *H01L 23/49827* (2013.01); *H01L 21/56* (2013.01); *H01L 23/3121* (2013.01); *H01L 21/563* (2013.01); *H01L 23/13* (2013.01); *H01L 23/3142* (2013.01); *H01L 21/565* (2013.01); *H01L 2224/16225* (2013.01); *H01L 2924/16151* (2013.01); *H01L 2924/19105* (2013.01); *H01L 2224/16245* (2013.01)
USPC ....................................................... 257/774

(58) Field of Classification Search
CPC ................. H01L 23/5226; H01L 2924/01078; H01L 2924/01079; H01L 23/481; H01L 2924/01029
USPC ......... 257/431–434, 443–444, 457, 621–622, 257/738, 676–732, 779–780, 48, 462, 774; 438/33, 68, 113–114, 458, 460, 462, 438/465
See application file for complete search history.

(56) References Cited

U.S. PATENT DOCUMENTS

| | | | | |
|---|---|---|---|---|
| 5,847,458 | A * | 12/1998 | Nakamura et al. | 257/738 |
| 2001/0042908 | A1* | 11/2001 | Okada et al. | 257/678 |
| 2003/0155656 | A1* | 8/2003 | Chiu et al. | 257/774 |
| 2006/0186517 | A1* | 8/2006 | Jang | 257/676 |
| 2007/0138644 | A1* | 6/2007 | McWilliams et al. | 257/774 |
| 2011/0285032 | A1* | 11/2011 | Yen et al. | 257/774 |

FOREIGN PATENT DOCUMENTS

| | | | |
|---|---|---|---|
| JP | 2012-28744 | * | 2/2012 |
| JP | 2012028744 | * | 2/2012 |

\* cited by examiner

*Primary Examiner* — Steven Loke
*Assistant Examiner* — Didarul Mazumder
(74) *Attorney, Agent, or Firm* — Novak Druce Connolly Bove + Quigg LLP

(57) ABSTRACT

A package assembly includes a substrate, an electronic component, and an encapsulation body. The electronic component is located on the substrate and electrically connected to the substrate. The encapsulation body encapsulates the electronic component with the substrate. A portion of the substrate corresponding to the electronic component defines a plurality of through holes. A diameter of each of the plurality of through holes gradually reduces from a top surface of the substrate toward a bottom surface of the substrate. The plurality of through holes prevent melting remnants of the encapsulation body from flowing outside of the substrate.

8 Claims, 5 Drawing Sheets

PACKAGE ASSEMBLY AND METHOD OF MANUFACTURING THE SAME

BACKGROUND

1. Technical Field

The present disclosure generally relates to package assemblies and methods for manufacturing the same, and more particularly to a package assembly with a plurality of through holes on a substrate.

2. Description of Related Art

Generally, a package assembly defines a plurality of through holes on a portion of substrate to dissipate heat, and the portion usually corresponds to large grounding pads. The plurality of through holes are filled with filling materials. However, if a large sized electronic component, such as a flip-flow chip, is packed on the substrate, air between the electronic component and the substrate is not easy to escape from the through holes, due to the filling materials filled in the plurality of through holes. As a results, cavities are unfortunately formed between the electronic component and the substrate, which leads to a weak performance of the package assembly.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
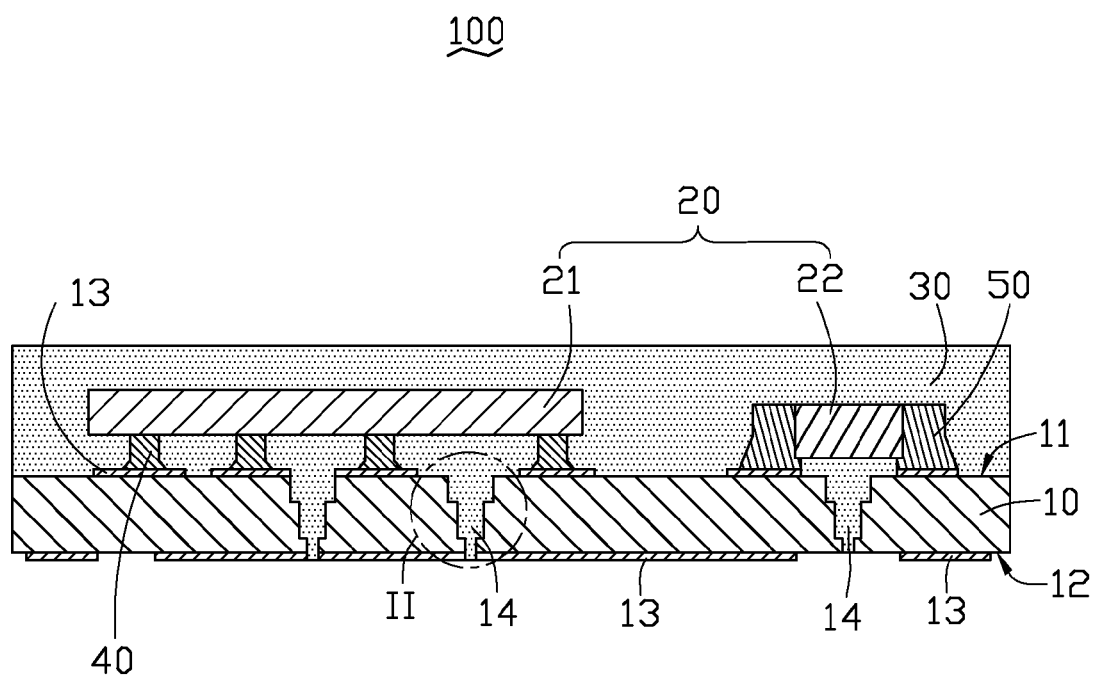
FIG. 1 is a schematic perspective view of a package assembly of an exemplary embodiment of the disclosure.

With reference to FIG. 1, a package assembly 100 includes a substrate 10, a plurality of electronic components 20 on a top surface 11 of the substrate 10 and electrically connected to the substrate 10, a encapsulation body 30 encapsulating the electronic components 20 with the substrate 10. The top surface 11 and a bottom surface 12 opposite to the top surface 11 includes a plurality of solder pads 13. The plurality of electronic components 20 are electrically connected to the substrate 10 via the plurality of solder pads 13. In the embodiment, the electronic components 20 may include a chip 21 (e.g., an integrated circuit, or a microprocessor) and a passive component 22. The chip 22 is fixed on the substrate 10 and electrically connected to the substrate 10 via a plurality of metal posts 40, and the passive component 22 is fixed on the substrate 10 and electrically connected to the substrate 10 via solder tin 50. Alternatively, the electronic components 20 may other components having a large size, such as a filter.

A portion of the substrate 10 corresponding to the plurality of electronic components 20 defines a plurality of through holes 14. An interior diameter of each of the plurality of through holes 14 gradually reduces from the top surface 11 of the substrate 10 toward the bottom surface 12 of the substrate 10, and the plurality of through holes 14 are used to prevent the melting remnants of the encapsulation body 30 from flowing outside of the substrate 10.

Figure 2:
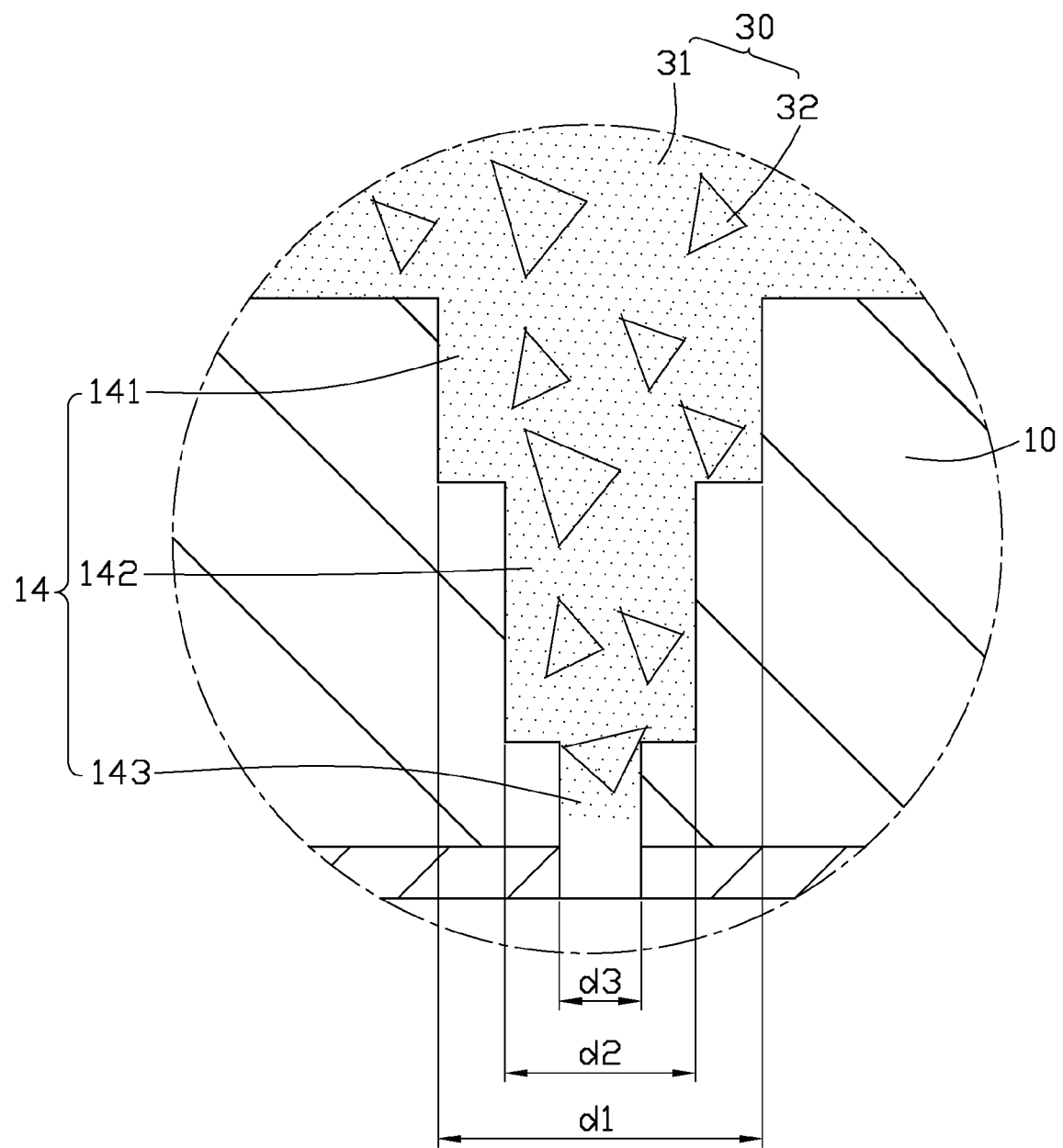
FIG. 2 is an enlarged view of part II of FIG. 1.

With reference to FIG. 2, in the embodiment, each of the plurality of the through holes 14 is in a shape of a step, and includes a first layer hole 141, a second layer hole 142 and a third layer hole 143. A interior diameter d1 of the first layer hole 141, a interior diameter d2 of the second layer hole 142, and a interior diameter d3 of the third layer hole 143 gradually reduces from the top surface 11 of the substrate 10 toward the bottom surface 12 of the substrate 10. That is, d1>d2>d3.

In the embodiment, each of the plurality of through holes 14 includes three layers holes. Alternatively, number of layers holes may be changed according to layout of substrate 10 of the package assembly 100, thickness of the substrate 10, and a size of the smallest exterior diameter of one of the plurality of filling grain 32 of the encapsulation body 30.

With reference to FIG. 2, the encapsulation body 30 includes a resin 31, and a plurality of filling grains 32 with different sizes. During an encapsulating process, melting encapsulation body 30 is filled in the plurality of through holes 14 with the plurality of filling grains 32 are stopped on the smallest interior diameter of each of the plurality of through holes 14. As a result, each of the plurality of the through holes 14 are jammed and sealed by the melting encapsulation body 30, which prevents the melting remnants of the encapsulation body 30 from flowing outside of the substrate 10. In the embodiment, because the smallest diameter d1 of each of the plurality of the through holes 14 is less than the smallest exterior diameter of one of the plurality of filling grains 32, the filling grain 32 having the smallest exterior diameter is stopped on the third layer hole 143 of each of the plurality of through holes 14.

In detail, during the encapsulating process, the melting encapsulation body 30 continually flows into each of the plurality of through holes 14 along gaps between bottoms of the electronic components 20 and the substrate 10. simultaneously, air between bottoms of the electronic components 20 and the substrate 10 flows into the plurality of through holes 14 along with the melting encapsulation body 30 and escapes from the plurality of through holes 14, which results a failure of cavities generation between bottoms of the electronic components 20 and the substrate 10. The interior diameter of each of the plurality of through holes 14 gradually reduces from the top surface 11 of the substrate 10 toward the bottom surface 12 of the substrate 10, and the smallest interior diameter of each of the plurality of through hole 14 is less than the smallest exterior diameter of one of the plurality of filling grains 32. When the plurality of filling grains 32 of the melting encapsulation body 30 flow at a bottom portion of each of the plurality of through holes 14, the plurality of filling grains 32 of the melting remnants of the encapsulation body 30 stops at a portion of the through holes 14. The portion has the smallest interior diameter. Simultaneously, the plurality of through holes 14 are jammed and sealed by the plurality of filling grains 32. Some of the resins 31 about to flow outside of the substrate 10 remain inside of the through holes 14 under a force of an outer air pressure, which prevents the resins 32 from flowing out of the substrate 10. So that, an operation of cleaning remaining resins 32 on the substrate 10 is passed over, which results in lower costs. In addition, the encapsulation body 30 is filled in the through holes 14, which leads to improvement of combination between the encapsulation body 30 and the substrate 10, and prevents delamination between the encapsulation body 30 and the substrate 10. So that, the reliability of the package assembly 100 improves.

Figure 5:
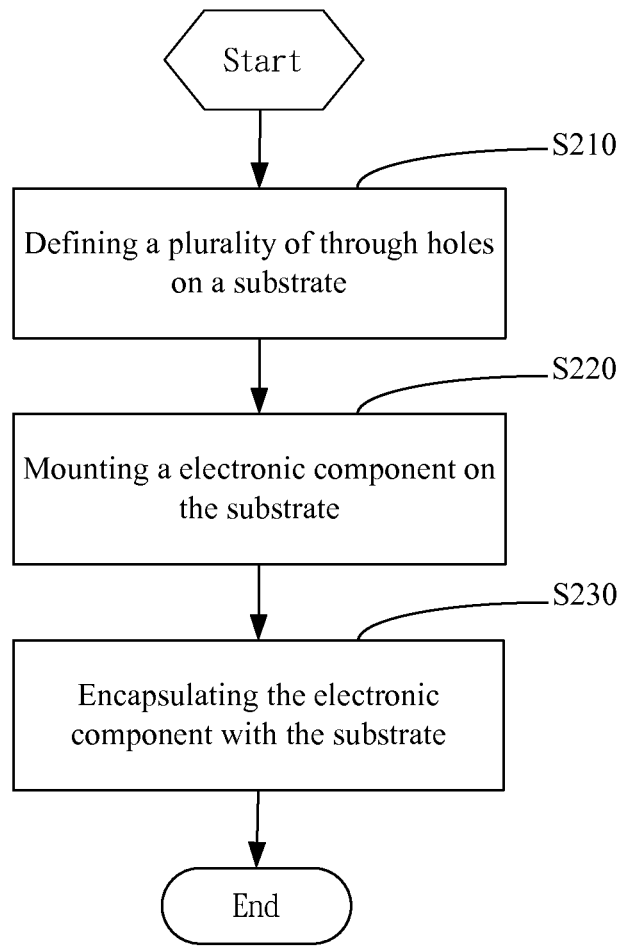
FIG. 5 is a flowchart of a fabricating method of the package assembly of an exemplary embodiment of the disclosure.

FIG. 5 is a flowchart of a fabricating method of the package assembly 100 of an exemplary embodiment of the disclosure. The fabricating method of the package assembly 100 includes steps as follows.

Figure 3:
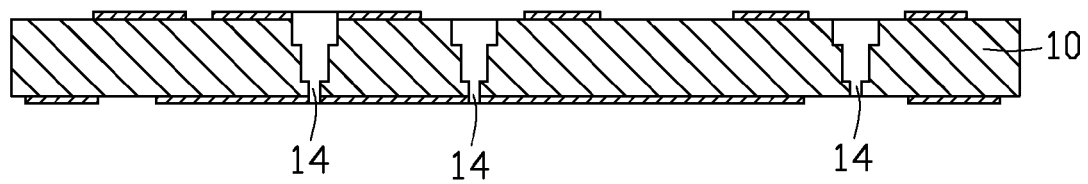
FIG. 3 is a schematic view of defining a plurality of through holes on a substrate.

With reference to FIG. 3 and FIG. 5, in step S210, the plurality of through holes 14 are defined on the substrate 10. The interior diameter of each of the plurality of through holes 14 gradually reduces from the top surface 11 of the substrate 10 toward the bottom surface 12 of the substrate 10. In the embodiment, the plurality of through holes 14 are defined by a drilling process. Alternatively, the plurality of through holes 14 may be defined by an etching process or a radiating process.

Figure 4:
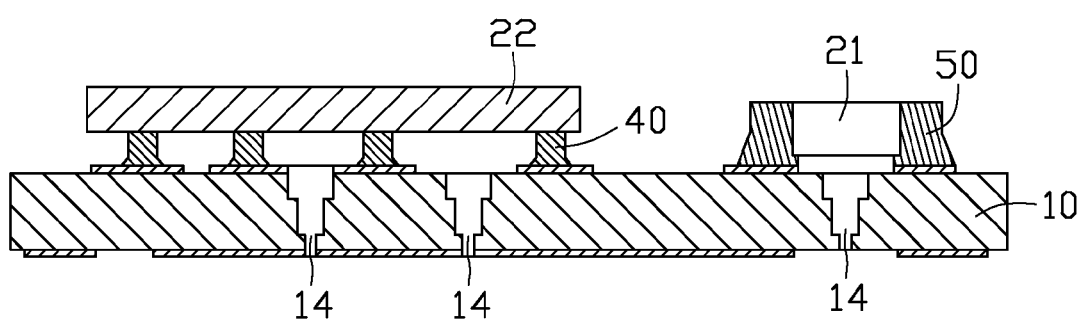
FIG. 4 is a schematic view of mounting electronic components on a portion of the substrate corresponding the plurality of through holes.

With reference to FIG. 4 and FIG. 5, in step S220, the plurality of electronic components 20 are mounted on the portion of the substrate 10 and electrically connected to the substrate 10. The portion of the substrate 10 corresponds to the plurality of through holes 14.

With reference to FIG. 1 and FIG. 5, in step S230, the plurality of electronic components 20 are encapsulated with the substrates 10 to form the encapsulation body 30. In the embodiment, the encapsulation body 30 encapsulates the electronic components 20 by a molding process.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A package assembly, comprising:
    a substrate;
    an electronic component located on the substrate and electrically connected to the substrate; and
    an encapsulation body encapsulating the electronic component with the substrate, wherein a portion of the substrate corresponding to the electronic component defines a plurality of through holes, the plurality of through holes is filled with the encapsulation body, a diameter of each of the plurality of through holes gradually reduces from a top surface of the substrate toward a bottom surface of the substrate, a smallest interior diameter of each of the plurality of through holes is less than an exterior diameter of a filling grain of the encapsulation body and wherein the plurality of through holes prevent melting remnants of the encapsulation body from flowing outside of the substrate.

2. The package assembly of claim 1, wherein each of the plurality of through holes has a glossy inside surface.

3. The package assembly of claim 1, wherein each of the plurality of through holes is in a shape of a step.

4. The package assembly of claim 3, wherein each of the plurality of through holes comprises a first layer hole, a second layer hole and a third layer hole, sizes of the first, second and third holes gradually reduce from the top surface of the substrate toward the bottom surface of the substrate.

5. A fabrication method of a package assembly, comprising:
    defining a plurality of through holes on a substrate, wherein an interior diameter of each of the plurality of through holes gradually reduces from a top surface of the substrate toward a bottom surface of the substrate;
    mounting an electronic component on a portion of the substrate corresponding to the plurality of through holes, the electronic component electrically connected to the substrate; and
    encapsulating the electronic component with the substrate to form an encapsulation body with the encapsulation body filled with the plurality of through holes, wherein a smallest interior diameter of one of the plurality of through holes is less than an exterior diameter of a filling grain of the encapsulation body, the plurality of through holes prevent melting remnants of the encapsulation body flowing outside of the substrate.

6. The fabrication method of the package assembly of claim 5, wherein each of the plurality of through holes is in a shape of a step.

7. The fabrication method of the package assembly of claim 6, wherein each of the plurality of through holes is formed by a drilling process.

8. The fabrication method of the package assembly of claim 6, wherein each of the plurality of through holes comprises a first layer hole, a second layer hole and a third layer hole, sizes of the first, second and third holes gradually reduce from the top surface of the substrate toward the bottom surface of the substrate.

* * * * *